(12) United States Patent
Sethuraman

(10) Patent No.: US 8,307,266 B2
(45) Date of Patent: Nov. 6, 2012

(54) CHAINED CHECKSUM ERROR CORRECTION MECHANISM TO IMPROVE TCP PERFORMANCE OVER NETWORK WITH WIRELESS LINKS

(75) Inventor: Muthu Sethuraman, Chennai (IN)

(73) Assignees: Anna University, Chennai (IN); KBC Research Foundation PVT. Ltd., Chennai (IN)

( * ) Notice: Subject to any disclaimer, the term of this patent is extended or adjusted under 35 U.S.C. 154(b) by 731 days.

(21) Appl. No.: 12/487,313

(22) Filed: Jun. 18, 2009

(65) Prior Publication Data

US 2010/0058153 A1   Mar. 4, 2010

(30) Foreign Application Priority Data

Sep. 2, 2008   (IN) .......................... 2151/CHE/2008

(51) Int. Cl.
*H03M 13/00* (2006.01)
(52) U.S. Cl. .................. 714/781; 714/746; 714/798
(58) Field of Classification Search .................. 714/781, 714/746, 758, 798, 784
See application file for complete search history.

(56) References Cited

U.S. PATENT DOCUMENTS 5,508,909 A * 4/1996 Maxwell et al. ............ 700/18
6,643,815 B1 * 11/2003 Davis et al. ............ 714/758

OTHER PUBLICATIONS

Alfredsson et al., TCP-L: Allowing Bit Errors in Wireless TCP, Proceedings of the 12th Annual IST Mobile & Wireless Communications Summit, Jun. 15-18, 2003, Aveiro, Portugal.
Alfredsson, TCP in Wireless Networks: Challenges, Optimizations and Evaluations, Thesis for the Degree for Licentiate of Computer Science, Department of Computer Science, Karlstad University, 2005, Karlstad, Sweden.

\* cited by examiner

*Primary Examiner* — Fritz Alphonse
(74) *Attorney, Agent, or Firm* — Maschoff Gilmore & Israelsen

(57) ABSTRACT

Data communication, with improved error detection, of a signal having a plurality of data blocks, by: error checking a received data block in a first sequence using a first polynomial, beginning with a first predetermined initial error checking state, producing a first CSUM; error checking the received data block in a second sequence using a second polynomial, using the first CSUM as a second predetermined initial error checking state, producing a second CSUM; comparing the second CSUM to the first predetermined initial error checking state to detect errors in the data communication; and repeating the above steps for sequential data blocks of the data communication, wherein the first polynomial is an inverse of the second polynomial.

20 Claims, 6 Drawing Sheets

FIG. 2A    FIG. 2B    FIG. 2C
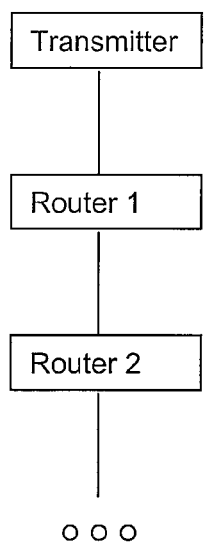
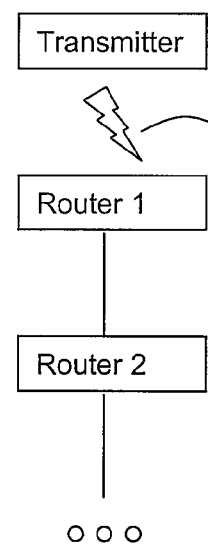
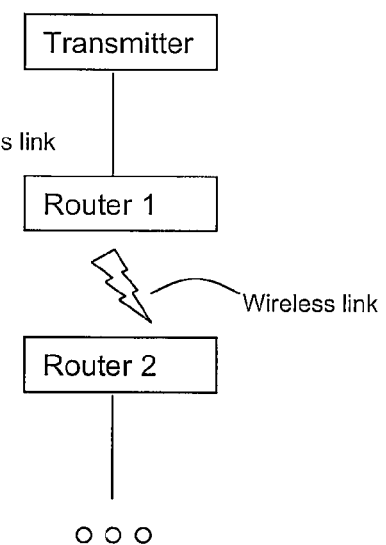
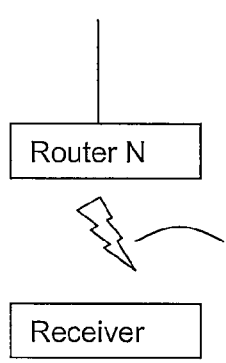
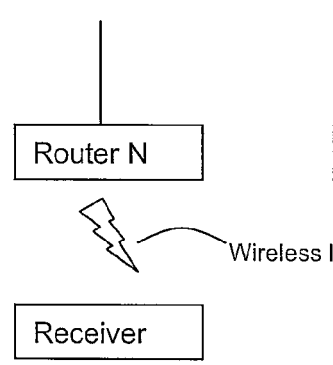
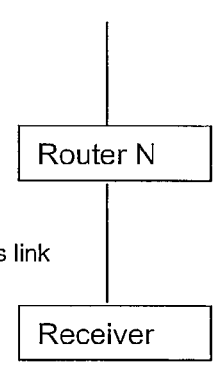

FIG. 3

TCP Header

| Bit offset | Bits 0-3 | 4-7 | 8-15 | 16-31 |
|---|---|---|---|---|
| 0 | Source port | | | Destination port |
| 32 | Sequence number | | | |
| 64 | Acknowledgement number | | | |
| 96 | Data offset | Reserved | CWR \| ECE \| URG \| ACK \| PSH \| RST \| SYN \| FIN | Window size |
| 128 | Checksum | | | Urgent pointer |
| 160 | Options (optional) | | | |
| 160/192+ | Data | | | | ined Patent
CHAINED CHECKSUM ERROR CORRECTION MECHANISM TO IMPROVE TCP PERFORMANCE OVER NETWORK WITH WIRELESS LINKS

CROSS-REFERENCE TO RELATED APPLICATION

The present application claims the benefit of Indian Patent Application No. 2151/CHE/2008, filed Sep. 2, 2008, which is hereby incorporated by reference in its entirety.

BACKGROUND

TCP communication systems were originally developed for use only over wired links. In recent years, various RF technologies have been used to implement wireless links. Error detection and correction mechanisms developed for TCP wired links do not adequately respond to the error characteristics of TCP wireless links.

SUMMARY

The present application relates, in general, to methods of improved error correction and detection of TCP communication over a noisy communication link. In accordance with one aspect of the present application, embodiments can achieve improved performance by chaining the checksums of multiple checksum fields in order to provide more robust error correction and detection.

The foregoing is a summary and thus contains, by necessity, simplifications, generalization, and omissions of detail; consequently, those skilled in the art will appreciate that the summary is illustrative only and is not intended to be in any way limiting. Other aspects, features, and advantages of the devices and/or processes and/or other subject matter described herein will become apparent in the teachings set forth herein. The summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

BRIEF DESCRIPTION OF THE FIGURES

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

FIGS. 2A-2C show examples of networks having both wired and wireless portions.

FIG. 3 shows the layout of fields within the TCP header.

DETAILED DESCRIPTION

Figure 1A:
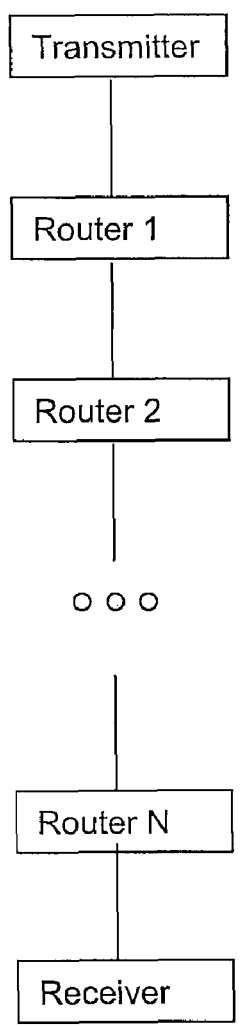
FIGS. 1A-1B show related art of a wired TCP network under normal conditions, and in the presence of a line break.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated and make part of this disclosure.

This disclosure is drawn, inter alia, to methods, apparatus, computer programs and systems related to a chained checksum error correction mechanism to improve TCP performance over a network having one or more wireless links.

More specifically, the embodiments contemplate data communication using a plurality of data blocks, providing improved error detection, by error checking a first time a received data block in one sequence through the data block, using a first polynomial, in which the initial state of the first error checker depends on an error check results of a previous data block, thereby producing a first computed error check result. The first computed error check result is compared to a first received error check result. If an error is indicated, then the received data block is error checked by a second error checker. The second error checker will proceed in a second sequence through the data block, using a second polynomial, with an initial state given by the first computed error check result. The result of the second error checker is referred here as a second computed error check result. The second computed error check result is then compared to the initial state of the first error checker, thereby determining whether the detected errors occurred in the data block or in the first received error check result. These steps are repeated sequentially for each data block of the data communication. The first polynomial is an inverse of the second polynomial.

The Transmission Control Protocol (TCP) is one of the core protocols of the Internet protocol suite. TCP provides reliable, sequenced delivery of a stream of bytes, making it suitable for applications like file transfer and e-mail. The entire suite may also be referred to as "TCP/IP." TCP manages a large fraction of the individual conversations between Internet hosts, for example between web servers and web clients. It is also responsible for controlling the size and rate at which messages are exchanged between the server and the client.

The Internet Protocol (IP) works by exchanging groups of information called packets. In cases of congestion, the IP can discard packets, and, for efficiency reasons, two consecutive packets on the Internet can take different routes to the destination. In that case, the packets can arrive at the destination in the wrong order. Higher levels of the networking protocol reorder packets to be in the correct order.

Packets, also called "segments," are short sequences of bytes consisting of a header and a body. The header describes the packet's destination; which routers on the Internet use to pass the packet along, generally in the right direction, until it arrives at its final destination. The body contains the application data. A TCP segment includes a header section and a data section. The header section further includes several fields used in the routing and control of TCP segment delivery, including a 16-bit checksum field. Under IPv4, the contents of the checksum field conventionally is governed by RFC 793, which states that the checksum field is the 16 bit one's complement of the one's complement sum of all 16-bit words in the header and text. If a segment contains an odd number of header and text octets to be combined in a checksum, the last octet is padded on the right with zeros to form a 16-bit word for checksum purposes. The pad is not transmitted as part of the segment. While computing the checksum, the checksum field itself is replaced with zeros.

Under IPv6, the contents of the checksum field conventionally is governed by RFC 2460, which states that any transport or other upper-layer protocol that includes the addresses from the IP header in its checksum computation must be modified for use over IPv6, to include the 128-bit IPv6 addresses instead of 32-bit IPv4 addresses.

Figure 1B:
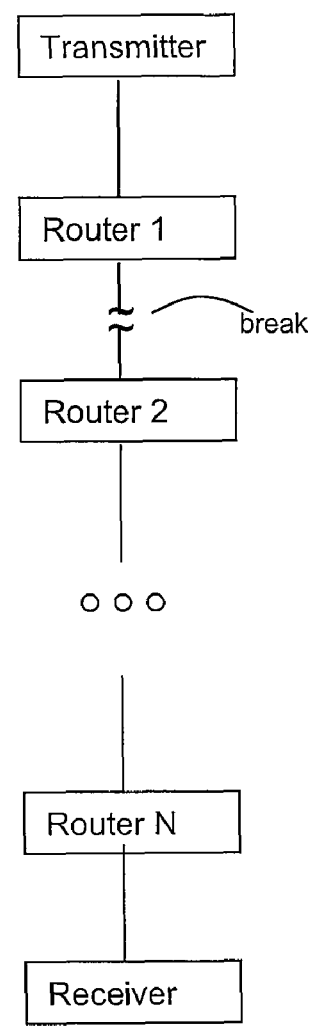

An exemplary hard-wired TCP communication link is shown in FIG. 1A. A failure of a hard-wired TCP communication link will generally result in a complete loss of the communication signal, e.g., by reason of a break in the wire as shown in FIG. 1B. Similarly, failure or degraded performance of routers in the TCP network, for instance by reason of congestion of incoming TCP segments at the router, will result in a greater probability of dropped segments. Dropped segments will appear to the receiver as a complete loss of the dropped segment. Conventional algorithms are known in the art for congestion avoidance and for requesting retransmission of dropped segments.

Exemplary TCP communication links having both hard-wired and wireless portions are shown in FIGS. 2A-2C. FIG. 2A shows a link having a receiver connected via a wireless link, and FIG. 2B shows both the transmitter and receiver connected via wireless links. FIGS. 2A and 2B are representative of networks using access points based on IEEE 802.11 technology (i.e., "WiFi"). Another configuration (not shown) is that the transmitter but not the receiver may be connected via a wireless link. FIG. 2C shows a configuration wherein a link between intermediate routers is based on wireless technology, for example IEEE 802.16 (i.e., "WiMax"). In light of the present disclosure, persons of ordinary skill in the art will realize that wireless communication technology other than WiFi or WiMax may also be used in one or more of the links shown.

In contrast to a purely wired TCP communication link, wireless reception is susceptible to degraded performance due to factors such as reduced signal strength, interference, frequency selective signal fading, antenna misalignment, etc. The effect of such degraded performance upon a wireless digital signal is to increase the bit error rate of the transmitted signal. If the degradations are not severe enough to cause a complete loss of communication, the wireless digital signal will be delivered with bit errors at the link level. A hard-wired digital communication link generally is not susceptible to degraded performance.

The conventional TCP mechanism does not distinguish segment loss due to errors in wireless reception as against loss due to congestion in the network. Consequently, when degraded wireless reception causes bit errors and errored links, congestion avoidance procedures are invoked, producing a decrease in throughput. Any retransmission of errored segments consumes additional bandwidth, and furthermore any retransmitted TCP segments may still be susceptible to bit errors due to degraded wireless reception. Therefore, a solution that overcomes the effect of degraded wireless reception and errored links, thus avoiding the reduction in TCP throughput performance, is desirable.

TCP throughput can be improved by providing mechanisms that improve the reliability of the TCP header. Once a TCP segment with errors is delivered to a receiver in the correct sequential order, the receiver can recognize that the segment is errored, and can notify the sender by using the Error Loss Notification ("ELN") message. This process allows the sender to distinguish between errors introduced by, e.g., noisy transmission over wireless link, and segments entirely lost due to congestion. Distinguishing the cause in this way allows the Sender to avoid invoking congestion avoidance procedures, and avoiding any segment retransmissions that might otherwise be invoked, thereby leading to an improvement in throughput. However, the current error notification and recovery procedures of Layer 2 processing of wireless standards such as IEEE 802.11 ("WiFi") and IEEE 802.16 ("WiMax") attempt to repeat transmission of errored segments that are received. This eventually will lead to failure, and the whole MAC Service Data Unit ("MSDU") is dropped, triggering congestion avoidance procedures. The congestion avoidance procedures would be unnecessary if error correction procedures could be applied to the errored segment, rather than retransmitting the errored segment. In order to avoid unnecessary retransmissions, special reliable processing of the TCP header can be enabled at the receiver by allowing the MAC layer to pass an MSDU having errored segments.

The idea to make use of damaged TCP packets is at a first glance easily realized by accepting invalid TCP checksums. However, since the checksum covers both the TCP header and the data payload, it is not obvious if the error(s) is/are in the header or payload. This separation is important because the header contains (among other) information to deliver the data to the correct application, and in the correct order.

Embodiments disclosed herein improve the throughput of TCP performance by introducing a method to improve the handling of errored TCP segments. That method is referred herein as Chained Checksum ("chained CSUM") error processing, which operates by improving the reliability of TCP Header processing.

FIG. 3 shows the layout of fields within the TCP header. The TCP header contains information to deliver the data to the correct application; when an application wishes to communicate with TCP, it uses the concept of ports which multiplex the communication endpoints at a host. The header also contains information (the sequence number) to fit its payload into the data stream delivered to the application, control information to establish/close a connection, and a checksum covering the header and payload. The header includes an "Options" field, which is an optional field used by higher level protocols. The total length of the Options field is from zero to ten full 32-bit words, with the data offset field being adjusted appropriately to indicate the total number of 32-bit words in the Header.

It should be understood that although the embodiments herein are described with reference to TCP, the embodiments are also more generally applicable to other data communication protocols, for instance User Datagram Protocol ("UDP") or Stream Control Transmission Protocol ("SCTP"), that include an ability to embed into the data portion one or more fields recognizable by other protocols, and/or user-definable field(s) in a header portion.

In one embodiment, the TCP data source and data destination are configured to provide a more robust error detection and correction scheme, using the bits of a newly defined chained CSUM field in the TCP segment. "CSUM" as used herein may refer to either this newly defined field in the TCP segment, or to the contents of this field. The intended usage will be clear from the surrounding context. CSUM can be included in the Options field of the Header, or inserted at the beginning of the TCP data as a field recognized and used by other applications and/or protocols. The regular TCP checksum is retained for normal processing. Header processing typically will include removing CSUM by the time the segment is delivered to the application. When an errored segment is received having a header including a CSUM field, the errored segment will be inserted at the correct position in the data stream, thereby enabling the special reliable processing discussed above.

Error protection described herein can be provided for the whole header of the TCP segment, or only for preselected fields in the header. The priority of fields in the header for preselected fields will normally be: Sequence number, then destination port. The destination port is used to insert the segment into the correct connection, and the sequence number is used to insert the segment at the correct position. During a TCP connection, many of the fields of the header can be predicted or set to default values without significantly affecting the link performance, because the error notification and recovery procedures will recover the segment on subsequent delivery by the Sender.

The size of the CSUM field can be chosen commensurate with expected wireless link error performance and the length of the fields of header that is included for error protection. Generally, a longer CSUM will provide a more robust error detection and correction capability, and/or provide a given level of error detection and correction over a greater number of bits. A 32-bit CSUM calculated over only the sequence number field of 32 bits allows for a rate one-half invertible error protection code.

If the CSUM computed at the receiver does not match the received CSUM, the receiver will correct errors based only on the capability of the CRC code (e.g., rate ½ code). However, a mechanism to check for the correct receptions of CSUM, even though errors may be present in the data portion, can be provided by resorting to "inversion." Embodiments provided herein can provide inversion by chaining the CSUMs. The chaining operates in part by concatenating the CSUMs from more than one TCP segment. Even in the case of higher rate coders like rate ¾, ⅞, ¹⁵⁄₁₆, etc., once CSUM has been checked to be correct, the receiver obtains improved error correction. This is achieved by attempting to correct errors only in the data portion of the TCP segment. In embodiments herein, the receiver can extend the CSUM, thereby enabling improved error checking and correction.

Selected fields from the headers of more than one TCP segment may be combined to provide a more robust error detection and correction capability over the TCP segment headers so combined. It is assumed that all received TCP segments have been placed in the correct sequential order. The combined checksum is referred to herein as a chained checksum ("CSUM"). This embodiment is implemented on the sending side to generate TCP headers having their checksum fields chained together, and on the receiving side to be able to perform the error detection and correction of the received headers, based on a cyclic redundancy check ("CRC"). The ability to create a chained checksum and its error correcting capabilities leads to reliable recovery of errored headers, thus avoiding congestion avoidance procedures and unnecessarily slowing down transmissions.

CRC codes are well known in the art. A codeword "c" of a binary (n; k) CRC code consists of k data, or information bits, followed by n−k=r parity bits, also called check bits or CRC bits. These CRC bits are computed from the block of data bits. Viewing codewords as polynomials $c(x)$, with the i-th bit of the codeword being the coefficient of $x^i$ (the leading coefficients lead the codeword transmission and the 0-th bit concludes it), the code is associated with a predetermined generator polynomial $g(x)$ of degree r that evenly divides all the codewords $c(x)$. Polynomial operations take place in GF(2), the Galois Field of size two, with additions and subtractions being modulo 2. The code is linear, that is, the (bitwise) addition of any two codewords yields another codeword.

Given a binary information message m of length $|m| \leq k$, we compute r parity bits such that, when appended to m, the polynomial corresponding to that concatenation is evenly divisible by $g(x)$, and is thus a codeword. These r bits are the coefficients of the polynomial $C(m(x))$ that is computed from the polynomial $m(x)$ as follows:

$$C(m(x))=(x^r m(x)) \bmod g(x) \qquad (1)$$

Subtracting this remainder from the dividend $x^r m(x)$ yields $$c(x)=x^r m(x)-C(m(x))$$

which is evenly divisible by $g(x)$. Because $x^r m(x)$ has all its r least significant coefficients equal to 0, and the degree of $C(m(x))$ is at most r−1, and because in GF(2), subtraction is the same as addition, we can see the coefficients of $c(x)$ as the concatenation of $m(x)$ followed by the r coefficients of $C(m(x))$. In the case where the degree of $C(m(x))$ is smaller than r−1, we extend $C(m(x))$ with leading 0 coefficients.

$c(x)$ is transmitted to the receiver. Due to errors in transmission, the polynomial $c'(x)$ arriving at the receiver might be corrupted, and will be different from $c(x)$. The receiver detects errors in transmission using the maximum likelihood principle, taking into account the very small probability for distortion at any specific bit position. It tests $c'(x)$ for being a codeword. If it is not a codeword, a transmission error is clearly detected. If it is a codeword, then the codeword most likely sent is $c'(x)$ itself, and the receiver assumes no error occurred in transmission. Testing $c'(x)$ for being a codeword (i.e., evenly divisible by $g(x)$) can be done by repeating the sender calculations: compute r CRC bits from the first $|c'|-r$ bits of $c'(x)$, as in Eq. (1), and compare them against the trailing r bits of $c'(x)$. A mismatch indicates that $c'(x)$ is not a codeword. Alternatively, $c'(x)$ is evenly divisible by $g(x)$ if and only if feeding the whole of it, as if it were an information message, into the computation of Eq. (1), yields r zero bits.

As mentioned above, if the corrupted word c' happens to be a codeword, the receiver can not detect that it is corrupted. By the linearity of the code, this happens if and only if the error word e=c'−c (bitwise exclusive or) is a codeword by itself.

The classic hardware implementation of CRC computation and verification uses a binary linear feedback shift register (LFSR) of length r, wired according to the coefficients of $g(x)$. It takes $|m|$ clock cycles to feed message m through the LFSR, after which the contents of the LFSR are the r CRC bits for m.

Figure 4:
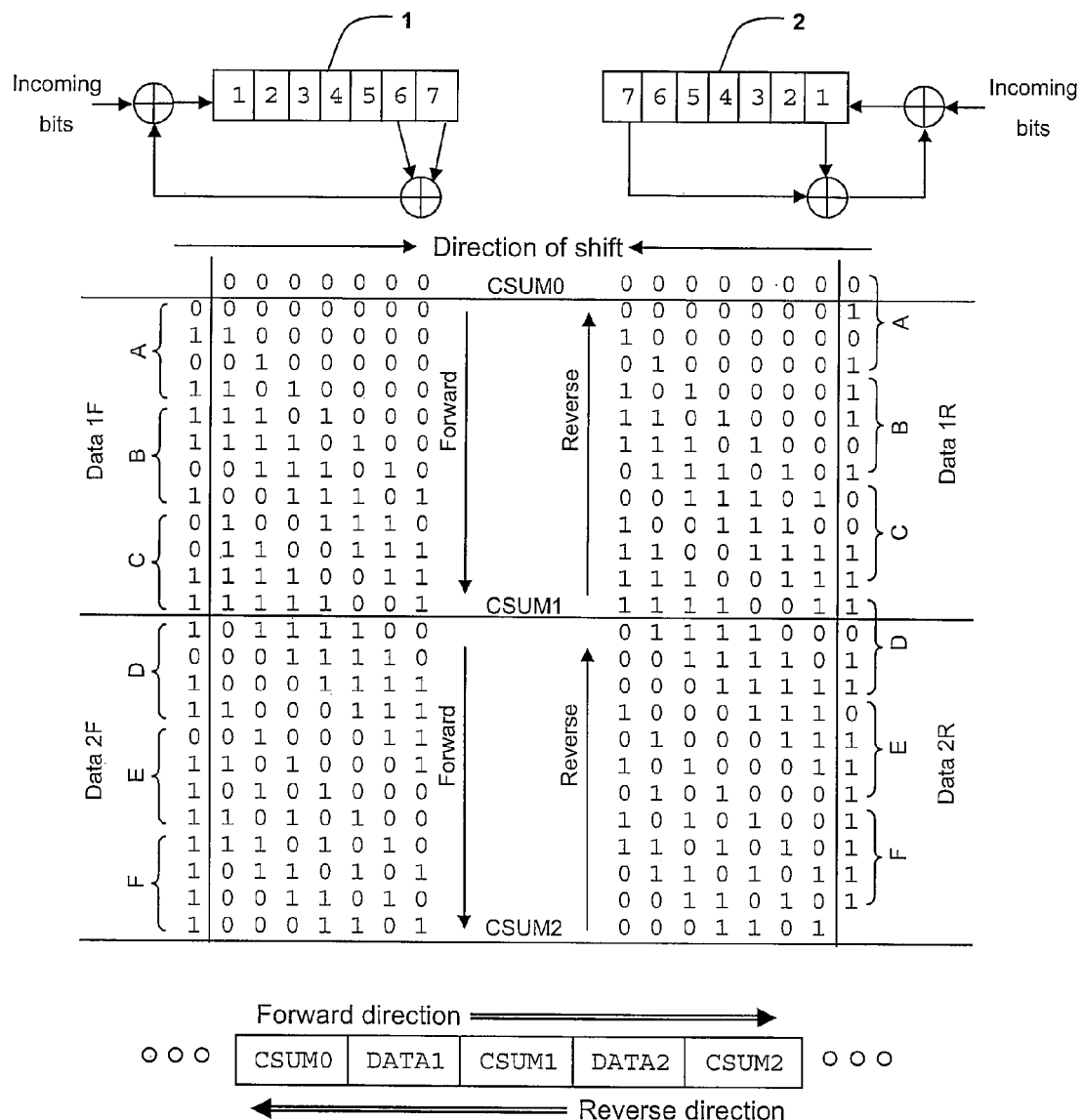
FIG. 4 shows exemplary chained checksum calculations as described herein.

FIG. 4 depicts an exemplary calculation of the chained checksum as the method acts upon exemplary input binary data. The processing at a sending terminal ("Sender") and a receiving terminal ("Receiver") is depicted using a 7-bit CSUM size. The Sender and the Receiver will both carry out the computations shown. "Forward direction" computation of CSUM is shown under first shift register 1, and will be carried out by both the Sender and Receiver. "Reverse direction" computation of CSUM is shown under a second shift register 2, and is carried out by only the Receiver. Each shift register has a length of 7 bits, but longer or shorter registers can be used, thereby providing more robust or less robust error detection and correction capability as described above.

An overview of the processing of FIG. 4 is presented below. A block of data is processed at a time. In FIG. 4, the blocks of data are $Data_1$ (i.e., $Data_1F$ for forward processing and $Data_1R$ for reverse processing); $Data_2$ (i.e., $Data_2F$ and $Data_2R$); and so forth. Each block of data is made up of 12 bits, as shown by the hex characters A-C and D-F, but other block lengths may also be used. In the forward direction, register 1 is initially at a value of $CSUM_{n-1}$ at the beginning of block $Data_n$. The received data of block $Data_nF$ is fed through register 1, producing a computed $CSUM_n$ from register 1 at the end of block $Data_nF$. If the computed $CSUM_n$ does not match the received $CSUM_n$, then an error is known to be present in either the received $Data_nF$ or the received $CSUM_n$.

If an error is present, then processing further in the Forward direction with $CSUM_n$ and $DATA_{n+1}$ produces $CSUM_{n+1}$. If the computed $CSUM_{n+1}$ and received ones match then there is no error in $CSUM_n$, narrowing the location of the error to the received $Data_nF$. When there are no errors in $DATA_{n+1}$ and $CSUM_{n+1}$, then $CSUM_{n+1}$ and $DATA_{n+1}$ are fed through register 2, in reverse order compared to the feed through register 1. Register 2 produces a computed $CSUM_n$ that is compared to the received $CSUM_n$:

If the computed $CSUM_n$ exactly matches the received $CSUM_n$, then the received $CSUM_n$ is good and it is $Data_nF$ that is in error.

If the computed $CSUM_n$ does not exactly match the received $CSUM_n$, then the received $CSUM_n$ is in error and $Data_nF$ may or may not contain errors.

The process then repeats for the next data block. A more detailed description of this processing follows.

Two arrays of bits in FIG. 4, below register 1 and register 2, show the contents of register 1 and register 2, with each consecutive row depicting the content of both registers after another bit has been shifted into each shift register. The bit array beneath register 1 is read downward as register 1 is clocked, and the bit array under register 2 is read upward as register 2 is clocked. FIG. 4 is drawn with each column of the bit array underneath the corresponding bit position of the shift register, for both register 1 and register 2.

Register 1 shifts from left to right, and the bit positions of register 1 are numbered as 1 through 7, going from left to right. The bit array below register 1 shows the incoming data in the left-most column, and the next 7 columns show the contents of the 7 bits of shift register 1, with bit 1 on the left and bit 7 on the right.

Register 1 implements the CRC generation polynomial $1+x^6+x^7$. Binary data corresponding to Data1F (having a hexadecimal value of: ABC) and Data2F (having a hexadecimal value of: DEF) are fed in sequence to register 1. The data that is fed into the registers may include portions of the TCP segment Header. The embodiment shown herein computes CSUM1 for Data1F starting with CSUM0, and from there computes the chained CSUM2 after Data2F has been fed into register 1. Generally, in the forward direction $CSUM_n$ is computed starting with $CSUM_{n-1}$. In light of the present disclosure, persons of ordinary skill in the art will recognize that other CRC generation polynomials can be used with the embodiments disclosed here.

Register 2 implements the CRC generation polynomial $1+x+x^7$. The CRC polynomial for register 2 is the inverse of CRC polynomial for register 1. The calculation of inverse CRC polynomials is well known to those skilled in the art. Reverse order binary data corresponding to Data2R (having a hexadecimal value of: FED) and Data1R (having a hexadecimal value of: CBA) are fed in sequence and this procedure computes CSUM1 starting with CSUM2 and then on computes CSUM0 starting with CSUM1. Generally, in the reverse direction $CSUM_{n-1}$ is computed starting with $CSUM_n$. In light of the present disclosure, persons of ordinary skill in the art will recognize that other CRC generation polynomials can be used with the embodiments disclosed here.

Register 2 shifts from right to left, and the bit positions of register 2 are numbered as 1 through 7, going from right to left. Register 2 is shown shifting from right to left in order to enable easier verification of intermediate outputs from register 1 and register 2. Verification is shown by the presence of matching content between register 1 and register 2 at every step/row. The bit array below register 2 shows the incoming data in the right-most column, and the 7 columns show the contents of the 7 bits of shift register 2, with bit 1 on the right and bit 7 on the left. The grouping of data shown in FIG. 4 illustrates a typical computation over only three hex characters. Other numbers of hex characters may be used, consistent with the error detection and/or correction capability of the CRC polynomial used. Computations involving register 1 and register 2 are carried out, in a particular direction, independently and without reference to each other.

The result of the CRC calculation is referred herein as a checksum (e.g., "CSUM0", "CSUM1", etc.) by convention, but it should be understood that this refers to CRC-based calculations as described herein. The result of the CSUM calculation is inserted into a new field "CSUM" in the TCP segment header, as described above. The conventional TCP checksum field in the header is retained during the computation described herein.

Checksum 0 ("CSUM0") shown in the example of FIG. 4 represents the starting condition in the forward direction, and in FIG. 4 it is all zeros. CSUM1 and CSUM2 are calculated and shown every 12 input bits. Each CSUM represents 7 bits from the CRC polynomial of register 1. In the forward direction, register 1 uses the 7 bits of CSUM0, plus the incoming data represented in FIG. 4 as Data1F, in order to produce the first 7 bits of CSUM1. Similarly, register 1 uses the 7 bits of CSUM1, plus the incoming data Data2F, in order to produce the 7 bits of CSUM2. In general, register 1 uses the 7 bits of $CSUM_i$, plus the incoming data $Data_{i+1}F$, in order to produce the 7 bits of $CSUM_{i+1}$.

In the reverse direction, register 2 uses the 7 bits of CSUM2, plus the incoming data Data2R, in order to produce the 7 bits of CSUM1. Similarly, register 2 uses the 7 bits of CSUM1, plus the incoming data Data1R, in order to produce the 7 bits of CSUM0. In general, register 2 uses $CSUM_i$, plus the incoming data $Data_iR$, in order to produce the 7 bits of $CSUM_{i-1}$.

The composite data transmitted in the forward direction conceptually will be the concatenation of CSUM0, Data1F, CSUM1, Data2F, CSUM2, etc., but will be implemented using field(s) in the header and/or data portion, as described earlier. "Forward direction" computation will enable production of CSUM0, CSUM1, CSUM2 etc. at the Sender and the same procedure at the receiver can be used to produce and check for CSUM0, CSUM1 CSUM2 matching. The "Reverse direction" computation conceptually will be the concatenation of CSUM2, Data2R, CSUM1, Data1R, CSUM0, etc., and will be invoked only at the receiver, and only when an errored header segment is received. In the manner described above, the terminal can produce a chained CSUM for a sequence of TCP header segments in both the forward and reverse directions.

Figure 5:
FIG. 5 shows a communication data stream received with an errored segment.

For every segment received, the receiver computes the CSUM of that header in order to verify integrity of the header. One method to detect and/or correct for errors in segment "i" is to compute the "Forward direction" CSUM computation starting with $CSUM_{i-1}$, followed by $DATA_i$. If the computed $CSUM_i$ matches with the received $CSUM_i$ then the segment "i" has been received without any errors. In case of errors in segment "i" (e.g., see FIG. 5), there will no match between the $CSUM_i$ computed by the receiver and the $CSUM_i$ sent by the transmitter, thereby indicating the presence of errors.

Another method to detect and/or correct for errors in segment "i" would to concatenate $CSUM_{i-1}$, $DATA_i$ and $CSUM_i$, treating the concatenation as a single codeword, forming parity equations and solving for errors. However, this error correction capability will be limited to that of higher rate coder.

Another method to detect and/or correct for errors in segment "i" would be to receive segment i+1 and compute $CSUM_{i+1}$. A match between the computed $CSUM_{i+1}$ and the received $CSUM_{i+1}$ indicates error free reception of segment i+1, and will also indicate that $CSUM_i$ is error free, because $CSUM_i$ was used as a starting point to compute $CSUM_{i+1}$. Detection and/or correction for errors in segment "i" would then proceed by carrying out a "Reverse computation" starting with $CSUM_{i+1}$, $DATA_{i+1}$ and a received $CSUM_i$, producing a calculated $CSUM_i$, and no errors will be indicated if the received $CSUM_i$ and calculated $CSUM_i$ match. If $CSUM_i$ is indicated to be error free, then we can use $CSUM_i$ as a starting point in the reverse computation to carry out error detection and/or correction using $CSUM_{i-1}$, and so on. If $CSUM_i$ is indicated to be error free, then any errors need to be corrected only in $DATA_i$.

Figure 6:
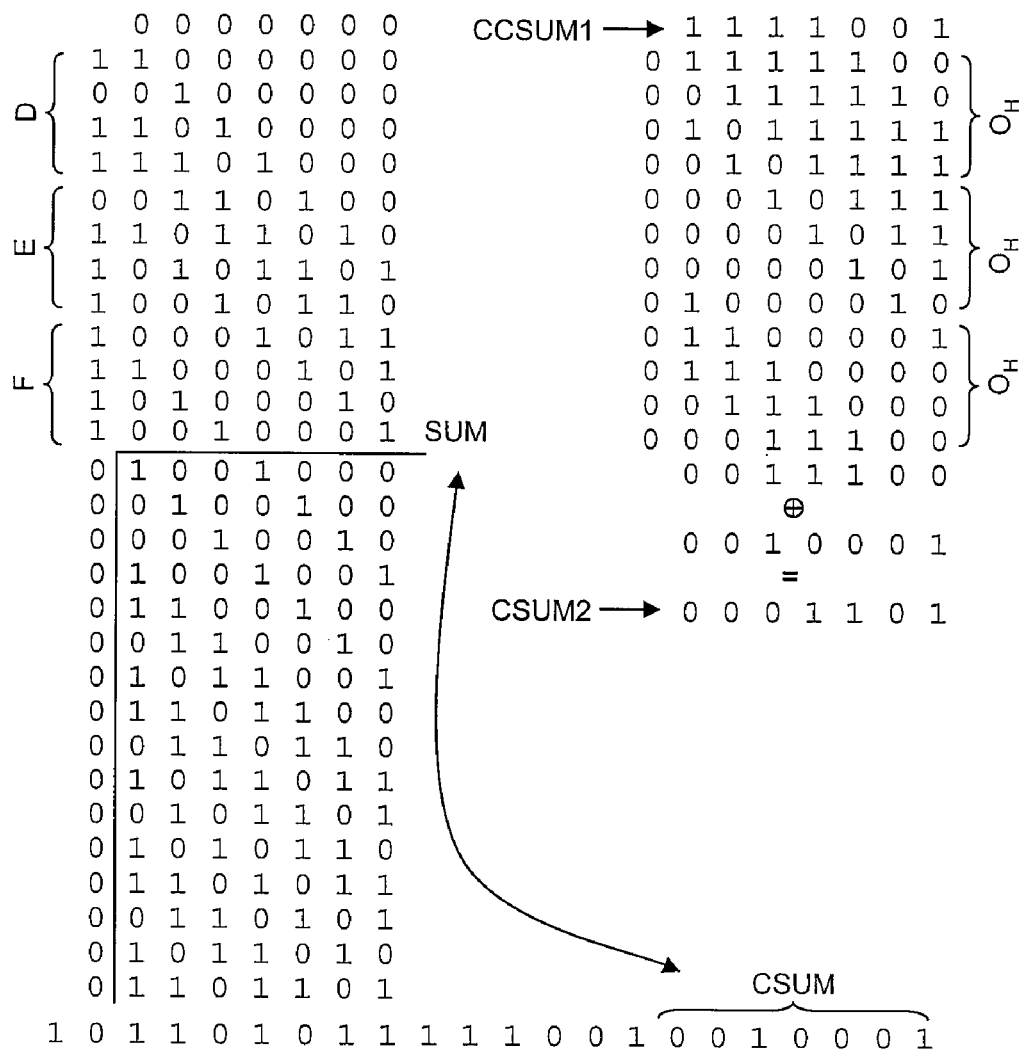
FIG. 6 shows exemplary chained checksum error recovery calculations as described herein.

If the error detection and/or correction processing uses a method other than using the triplet $CSUM_{i-1}$, $DATA_i$, $CSUM_i$, then it is possible to sever the chaining effect between $CSUM_i$ and $CSUM_{i-1}$ by using the linearity property of CRC codes. An embodiment of this capability is shown in FIG. 6. Severing the chaining allows the calculation of $CSUM_i$ by removing the effect of $CSUM_{i-1}$ from the error correction computation, thereby producing a more efficient method of determining whether the received $DATA_i$ contains errors. Once the chaining is broken, a new $CSUM_i$ is computed using only $DATA_i$, without effect from any errors in $CSUM_{i-1}$. The new $CSUM_i$ will be linear addition of: (1) a CSUM produced using $CSUM_{i-1}$ followed by all zeros as input data; and (2) CSUM produced with all zero Register content followed by $DATA_i$ as the data input. The extended CSUM is shown at the bottom of FIG. 6. Linearity is shown below the right-hand column of FIG. 6, in that CSUM2 can be shown to be linear sum of the CSUM from the left-hand column and the CSUM from the right-hand column.

Once the chaining is broken we get a new $DATA_i$ and a new $CSUM_i$ wherein the effect of $CSUM_{i-1}$ (forward direction) or $CSUM_{i+1}$ (reverse direction) has been removed. This leads to a lower rate code with improved correction capability to correct errors in $DATA_i$. The effect is that the contents of CSUM are calculated from the data bits in $DATA_i$ and a shift register having an initial state of all zeros. Further we can obtain an extended CSUM by running register 1 with a CSUM followed with all zero data. This process essentially brings out various parity equations and we can choose parity equations that are easier to solve. In light of the present disclosure, parity equations and methods to solve them are well known to persons of ordinary skill in the art.

Next, using knowledge of characteristics of the erroneous TCP segment, such as its Source Address, the Destination Address, the Source Port, the Destination Port, the Sequence number, etc., the erroneous TCP segment received can be placed heuristically in one of the existing TCP connections. This heuristic processing is described below in further detail.

The recovery algorithm works by first matching the packet to an existing connection. Choosing the wrong connection may cause data to be injected into a completely foreign stream. If there are few streams to different hosts and varying port numbers, the chances of mapping a packet to the wrong connection is minimized. However, if there is a set of connections that share one end point and have consecutive local port numbers, the risk of mapping to the wrong connection is increased.

Another issue is the sequence number. This determines where in the stream the payload belongs. The importance of the sequence number depends on the applications, for instance some applications like audio or visual playback may tolerate "data reordering", or "data truncation" for example.

When errors are confined to $DATA_i$, then integrity verification using $CSUM_i$, $DATA_{i+1}$ and $CSUM_{i+1}$ is adequate. When errors are confined to $CSUM_i$, then integrity verification can be performed by the methods described herein. The steps of one embodiment are described below:

Step 1: Compute a "Forward computation" of $CSUM_i$ using $CSUM_{i-1}$ and $DATA_i$, producing a computed forward $CSUM_i$. If the computed $CSUM_i$ does not match with the received $CSUM_i$ when there may be errors in $CSUM_i$ or $DATA_i$.

Step 2: Compute a "Reverse computation" of $CSUM_i$ using $CSUM_{i+1}$ and $DATA_{i+1}$, producing a computed reverse $CSUM_i$. If the computed forward $CSUM_i$ from Step 1 matches the computed reverse $CSUM_i$ from Step 2, then this indicates that there are no errors in $DATA_i$, $DATA_{i+1}$ and $CSUM_{i+1}$.

If the results of step 1 and step 2 indicate that there are no errors then $DATA_i$ and $DATA_{i+1}$ can be used for further processing of the header. If the CSUMs of step 1 and step 2 do not match, then errors may be present in any or all of fields $DATA_i$, $DATA_{i+1}$, $CSUM_i$ and $CSUM_{i+1}$. If the error is confined to $CSUM_i$, then the received $CSUM_i$ will not match with either the computed Forward $CSUM_i$ or the computed Reverse $CSUM_i$, although the Forward and Reverse computed CSUMs will match with each other. If this CSUM calculation indicates that errors are present, then the heuristic processing described below is used to place the erroneous TCP segment into one of the TCP connections.

The two values that identify each endpoint of a TCP connection, the IP address and a port number, are often called a socket. The socket pair for a TCP connection is the four-tuple that defines the two endpoints of the connection: the local IP address, local port, foreign IP address and foreign port. A socket pair uniquely identifies every TCP connection on a network. For SCTP, an association is identified by a set of local IP addresses, a local port, a set of foreign IP addresses, and a foreign port. In a simple form, when neither endpoint is multi-homed, this results in the same four-tuple socket used with TCP. However, when either of the endpoints of an association are multihomed, then multiple four-tuple sets (with different IP addressed but the same port numbers) may identify the same association.

If the TCP segment has been received without errors, or if the error correction processing described above has successfully corrected any errors present, then there will be a match of available TCP connections to values of the TCP segment header fields Source Address, Source Port, Destination Address, Destination Port. Furthermore, if the regular TCP checksum also matches then that TCP segment can be delivered to the application. New TCP connection attempts also will succeed as there are no errors after processing.

However, if there is a failure of the TCP checksum verification, then the response may depend on the tolerance to errors of the data traffic being carried. For instance, multimedia data is tolerant of errors and TCP segments failing the checksum still can be uploaded to the application for usage. On the other hand, a connection carrying non-multimedia data may be sensitive to any errors in the data portion of TCP segments, and therefore an ACK with ELN notification should be sent to Sender so that the TCP segment will be retransmitted.

In the situation of partially protected headers (i.e., headers having only a portion of the fields covered by the checksum calculations described herein), and also on failure of header error processing, heuristic processing can place the received TCP segment in an existing connection at the correct position in the data stream for that connection. In one embodiment, the most probable connection for placing the TCP segment can be determined by looking for the maximum level of bit-by-bit matching of the received TCP segment socket pairs to the socket pairs known in use by the receiver. If several possible candidate socket pairs are found, then the process can be repeated by including the expected sequence number and/or the expected ACK numbers included in the bit-by-bit matching match. If a resolution is not possible then the segment is discarded.

The constant header fields of the received TCP segment {Src Port, Dest Port, hdr length, URG, ACK,RST and SYN} are matched to those found in the connections known to the receiver. At this stage, certain other fields are not used in the matching (i.e., they are "don't care" fields)—such fields may include the ACK number, adv. Window, PSH, FIN and urgent pointers—and any such "don't care" fields may be set to safe default values.

Checking the sequence number involves examining the received sequence number to see if it bears an expected sequence number in relation to earlier received segments. If the sequence number equals the last sent ACK, then it is assumed that the sequence number is correct. Because the sequence numbers are spaced by a predetermined value, multiples of the segment sizes can be added to the value of the last sent ACK to determine if there is a match. If there is a match, then it is assumed that the segment was delivered out of order, so the segment is accepted and placed in the correct order for its TCP connection.

If sequence number still does not any of the above criteria, it is discarded and an Explicit Loss Notification ("ELN") is sent to Transmitting host to enable recovery using retransmission. ELN is a mechanism by which the reason for the loss of a packet can be communicated to the TCP sender. Typically, ELN provides a way by which senders can be informed that a loss happened because of reasons unrelated to network congestion (e.g., due to wireless bit errors), so that sender retransmissions can be decoupled from congestion control. If the receiver or a base station knows for sure that the loss of a segment was not due to congestion, it can set the ELN bit in the TCP header and propagate it in a message back to the source.

The embodiments presented above are realizable in a computing device configured to receive the data communication, and/or perform error check calculations. Such a device may include, for instance, any combination of: a general purpose computer; an embedded processor; a special-purpose processor; a CPU; an ASIC; firmware. The computing device may further include software that carries out at least a portion of the calculations used in the embodiments presented above.

There is little distinction left between hardware and software implementations of aspects of systems; the use of hardware or software is generally (but not always, in that in certain contexts the choice between hardware and software can become significant) a design choice representing cost vs. efficiency tradeoffs. There are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the re recitation of "two recitations," without other modifiers, typically means at least two recitations, or two or more recitations). Furthermore, in those instances where a convention analogous to "at least one of A, B and C," etc. is used, in general such a construction is intended in the sense one having skill in the art would understand the convention (e.g., "a system having at least one of A, B and C" would include but not be limited to systems that have A alone, B alone, C alone, A and B together, A and C together, B and C together, and/or A, B and C together, etc.). In those instances where a convention analogous to "at least one of A, B or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All references, including but not limited to patents, patent applications, and non-patent literature are hereby incorporated by reference herein in their entirety.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The invention claimed is:

1. A method of receiving a data communication comprising a plurality of data blocks, with improved error detection, over a network including at least one wireless link, the method comprising:
   error checking a received data block in a first sequence using a first polynomial, beginning with a first predetermined initial error checking state to produce a first checksum, wherein the error checking is performed using a first error checker;
   error checking the received data block in a second sequence using a second polynomial, using the first checksum as a second predetermined initial error checking state to produce a second checksum;
   comparing the second checksum to the first predetermined initial error checking state to detect errors in the data communication; and
   repeating the above steps for sequential data blocks of the data communication,
   wherein the first polynomial is an inverse of the second polynomial.

2. The method of claim 1, further comprising deriving the first predetermined initial error checking state from a previously received data block.

3. The method of claim 1, wherein the error checking further comprises a cyclic redundancy check.

4. The method of claim 1, wherein the first polynomial comprises $1+x^6+x^7$, and the second polynomial comprises $1+x+x^7$.

5. The method of claim 1, wherein the second sequence is in the opposite direction of the first sequence.

6. The method of claim 1, further comprising comparing the first checksum to a cyclic redundancy check field in the received data communication.

7. The method of claim 1, wherein the data communication comprises using a transmission control protocol.

8. The method of claim 1, wherein the error checking the received data block in a second sequence is performed using a second error checker.

9. The method of claim 1, wherein the first error checker is a processor and the error checking the received data block in a second sequence is performed using the first error checker.

10. An apparatus for receiving a data communication comprising a plurality of data blocks, with improved error detection, over a network including at least one wireless link, the apparatus comprising:
- a first error checker configured to check a received data block in a first sequence using a first polynomial, beginning with a first predetermined initial error checking state, producing a first checksum;
- a second error checker configured to check the received data block in a second sequence using a second polynomial, using the first checksum as a second predetermined initial error checking state, producing a second checksum; and
- a comparator configured to compare the second checksum to the first predetermined initial error checking state to detect errors in the data communication,
- wherein the first polynomial is an inverse of the second polynomial.

11. The apparatus of claim 10, wherein the first error checker is further configured to derive the first predetermined initial error checking state from a previously received data block.

12. The apparatus of claim 10, wherein at least one of the first error checker and second error checker further comprises a cyclic redundancy checker.

13. The apparatus of claim 10, wherein the first polynomial comprises $1+x^6+x^7$, and the second polynomial comprises $1+x+x^7$.

14. The apparatus of claim 10, wherein the second sequence is in the opposite direction of the first sequence.

15. The apparatus of claim 10, further comprising a comparator configured to compare the first checksum to a cyclic redundancy check field in the received data communication.

16. The apparatus of claim 10, wherein the data communication comprises using a transmission control protocol.

17. An apparatus for transmitting a data communication comprising a plurality of data blocks, with improved error detection, over a network including at least one wireless link, the apparatus comprising:
- a parity generator configured to generate parity over a transmitted data block, in a predetermined sequence, beginning with a first predetermined initial error checking state, using a parity generator polynomial, producing a parity generator result, wherein the first predetermined initial error checking state is derived from a parity generator result from a previously transmitted data block;
- a means for inserting the parity generator result into at least one data block; and
- a means for transmitting the plurality of data blocks to a receiver.

18. The apparatus of claim 17, wherein the data communication comprises using a transmission control protocol.

19. The apparatus of claim 17, wherein the parity generator polynomial comprises $1+x^6+x^7$.

20. The apparatus of claim 17, wherein the first predetermined initial error checking state comprises a checksum.

* * * * *

UNITED STATES PATENT AND TRADEMARK OFFICE
CERTIFICATE OF CORRECTION

PATENT NO. : 8,307,266 B2  
APPLICATION NO. : 12/487313  
DATED : November 6, 2012  
INVENTOR(S) : Sethuraman Page 1 of 1

It is certified that error appears in the above-identified patent and that said Letters Patent is hereby corrected as shown below:

In the Drawings

In Fig. 6, Drawing Sheet 6 of 6, delete "CCSUM1" and insert -- CSUM1 --, therefor.

In the Specifications

In Column 13, Line 37, delete "farther" and insert -- further --, therefor.

Signed and Sealed this
Thirteenth Day of August, 2013

Teresa Stanek Rea
*Acting Director of the United States Patent and Trademark Office*

UNITED STATES PATENT AND TRADEMARK OFFICE
Certificate

Patent No. 8,307,266 B2                                                   Patented: November 6, 2012

On petition requesting issuance of a certificate for correction of inventorship pursuant to 35 U.S.C. 256, it has been found that the above identified patent, through error and without any deceptive intent, improperly sets forth the inventorship.
    Accordingly, it is hereby certified that the correct inventorship of this patent is: Sethuraman Muthu, Chennai (IN).

Signed and Sealed this Twenty-fifth Day of November 2014.

ALBERT DECADY
*Supervisory Patent Examiner*
Art Unit 2112
Technology Center 2100